United States Patent [19]

Flaim et al.

[11] Patent Number: 5,362,608
[45] Date of Patent: Nov. 8, 1994

[54] MICROLITHOGRAPHIC SUBSTRATE CLEANING AND COMPOSITIONS THEREFOR

[75] Inventors: Tony D. Flaim, St. James; James Lamb, III; Terry Brewer, borh of Rolla, all of Mo.

[73] Assignee: Brewer Science, Inc., Rolla, Mo.

[21] Appl. No.: 935,572

[22] Filed: Aug. 24, 1992

[51] Int. Cl.⁵ .......................... B05D 5/12; G03C 5/00
[52] U.S. Cl. .................................. 430/327; 430/331; 134/33; 134/38; 427/240; 427/273
[58] Field of Search ................. 430/327, 331; 134/33, 134/38; 427/240, 273

[56] References Cited

U.S. PATENT DOCUMENTS

| | | | |
|---|---|---|---|
| 4,113,492 | 9/1978 | Sato | 430/271 |
| 4,271,261 | 6/1981 | Shimizu | 430/325 |
| 4,510,176 | 4/1985 | Cuthbert | 437/228 |
| 4,518,678 | 5/1985 | Allen | 430/311 |
| 4,664,721 | 5/1987 | Valasek | 588/206 |
| 5,139,607 | 8/1992 | Ward | 430/329 |

*Primary Examiner*—Marion E. McCamish
*Assistant Examiner*—Kathleen Duda
*Attorney, Agent, or Firm*—Veo Peoples, Jr.

[57] ABSTRACT

THFA (tetrahydrofurfuryl alcohol) is employed as the active component of edge bead removal compositions negating the need for N-methylpyrrolidone and providing unexpected effectiveness for multilayer microelectronic edge beads having at least one highly polar aromatic polymer layer, particularly when such layer is adjacent to an acid-catalyzed photoresist.

8 Claims, No Drawings

MICROLITHOGRAPHIC SUBSTRATE CLEANING AND COMPOSITIONS THEREFOR

BACKGROUND OF THE INVENTION

1. Field of the Invention

The present invention relates to organic strippers, cleaners and rinsing solutions used on microlithographic substrates and is particularly concerned with the improved removal of highly polar aromatic polymers and copolymers from the edge of substrate.

2. Background of the Prior Art

Single and/or multiple layers of microlithographic coatings including, for example, photoresist layers, planarization layers, anti-reflective coatings, etc., are applied onto microelectronic wafer substrates such as glass, silicon, etc., by a technique called spincoating. These coatings will invariably thicken and build up residues at the wafer's edge, often overflowing onto the backside of the wafer edge. These residues, often referred to as "edge beads", must be removed to avoid contamination during subsequent handling and processing.

If the "edge beads" are not removed prior to subsequent processing steps, such as softbake, exposure and development, then, during the course of such subsequent processing, the edge beads will tend to crumble, generating extraneous particles that lead to surface defects in the image topography.

Compositions to remove the "edge beads" are known as "edge bead removal solvents" or "EBRs".

In the past, "the" one active ingredient for all EBRs, known to be universally effective for composite microlithographic edge beads, despite the edge beads' particular polymer chemistry, is N-methylpyrrolidone (NMP). However, the EBRs containing NMP inherently require long spin cycles, after the cleaning application, to dry the edge of the substrate. Even then, such EBRs leave a further liquid residue which requires an additional baking step for removal. Also, the amine components in NMP can contaminate the photoresist.

When, in addition to removing a "photoresist" edge bead, it is also necessary to remove edge beads comprised of other layer material comprising highly polar aromatic polymers, further problems arise. Such polymers are characterized by having a predominance of benzenoid rings in the backbone of the polymer with the rings being connected by polar chemical linkages such as amic acid, sulfone, amide, urea, ether and carbonyl groupings. These polymers are formulated to avoid interfacial mixing with the photoresist and therefore have mutually exclusive dissolution characteristics from the photoresist and incompatible solvents. Typically, they also have glass transition temperatures (Tg) in excess of 100° C.

Other EBR components, which might tend to solve the NMP problems, will not dissolve the highly polar aromatic edge beads, or tend to create dangerous peroxides, or are toxic, or will not rinse with water. Typical of such ineffective EBRs are ethylene and propylene glycol monomethyl ethers, the corresponding acetate derivatives, butyl acetate, ethyl lactate, ethyl-3 ethoxypropionate, ethyl pyruvate, higher glycol ethers such as butyl Cellosolve ®, higher glycol ether acetates, glymes, notably diglyme; aliphatic, cycloaliphatic, aromatic ketones including cyclopentanone; aromatic hydrocarbons, tetrahydrofuran (THF) and alcohols.

Alcohols, including aliphatic (e.g., ethanol), cycloaliphatic (e.g., cyclohexanol) and aryl-aliphatic (e.g., benzyl alcohol) are generally known to be ineffective solvents for highly polar aromatic polymers.

An additional drawback to the employment NMP, or other chemically basic EBRs, is that they contaminate acid-catalyzed types of photoresist such as IBM's APEX ® and OCG's CAMP IV ® positive tone, deep ultraviolet acid-catalyzed photoresist. If the spin bowl is contaminated with basic impurities, such as amine material, then the photosensitivity of the resist is materially weakened, leading to defects in the image pattern. Absent thoroughly rinsing the spin bowl after each EBR spin, the accumulation of impurities serves to progressively deteriorate the integrity of each successive lamination.

In fact, in many instances, the amine contamination problems are so severe for acid-catalyzed photoresist, that manufacturers will avoid edge bead removal altogether, tending instead to cope with the particle defects that arise from the crumbling edge beads.

Other options for employing non-basic EBRs rather than NMP in the past have included the use of, for example, cyclohexanone. This method permitted softening and swelling of antireflective coatings edge beads and their partial removal. However, one serious drawback to such process is an attendant generation of a spider-web-like residue. Such residue requires a cumbersome and extraneous cleaning operation.

Accordingly, it is an object of the present invention to provide an improved microlithographic cleaning composition and method suitable for faster composite edge bead removal.

It is a further object of the present invention to provide an improved edge bead removal process for microlithographic edge beads including highly polar aromatic polymers without deleterious side-effects.

It is also an object of the present invention to provide an effective EBR composition for acid-catalyzed photoresist, negating interaction tending to contaminate the photoresist.

Another principle object of the present invention is to provide an improved method for edge bead removal with reduced spin cycle and which negates the need for a baking step when removing residual liquid EBRs.

SUMMARY OF THE INVENTION

The above-described objects, and others which become apparent from the Detailed Description Tables and Examples, are achieved by employing tetrahydrofurfuryl alcohol (THFA) as the active ingredient in edge bead removal compositions, negating the need for NMP. The use of THFA enables reduction in time of the edge bead removal spin cycle by 25% and leaves less heavy liquid residues which can be transferred to water handling equipment.

Thus, THFA alone or in admixture with other solvents such as esters, ketones, alcohols and glycol ethers serves as a particularly improved edge bead remover for microlithographic polymers, enabling a shorter EBR cycle and negating an EBR bake step.

Thus, where such microlithographic polymers are acid-catalyzed photoresist, the compositions and methods of the present invention are employed in an edge bead removal cycle without contaminating the polymer photosensitivity and without formation of spider-web-like residues.

Thus, where highly aromatic polar polymers such as certain anti-reflective layers are present with photoresist layers in multilayer microlithographic production, the present invention can be employed to surprisingly remove the composite "edge beads" of all layers. Previously known solvents for highly aromatic polar polymers were believed to be mutually exclusive from photoresist solvents, absent deleterious side-effects.

DETAILED DESCRIPTION OF THE INVENTION AND PREFERRED EMBODIMENTS

In the process of the present invention, THFA having the formula

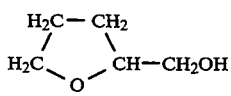

is employed as the active ingredient for edge bead removal and backside wafer cleaning of microelectronic compositions, particularly those compositions comprising highly polar aromatic polymers. THFA is commercially available from a number of sources or may be produced from well-known methods.

However, THFA is an alcohol derivative of THF. THF has the formula

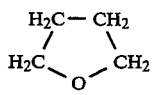

THF, although a well-known solvent for polymers is not generally known to dissolve highly aromatic polar polymers, particularly, for example, polyurea anti-reflective coatings. Ordinarily, it would be expected that a THF alcohol derivative would be ineffective in this instance. It is particularly unexpected that THFA would dissolve edge beads of highly polar aromatic polymers such as discovered in the present invention because THF is ineffective, and because alcohols including aliphatic (e.g., ethanol), cycloaliphatic (e.g., cyclohexanol), aryl-aliphatic (e.g., benzyl alcohol) are generally known to be ineffective EBRs for polyamic acids and other highly polar aromatic polymers used as microlithographic coatings.

THFA, like other organic solvents, has been previously disclosed as a potential solvent for certain non aromatic compositions. For example, THFA has been disclosed as a solvent but dissolved non-aromatic or aliphatic photoresist, and contrary to the present invention, was nonmiscible (no interfacial mixing) with anti-reflective coatings. See SPIE, Vol. 539, pp. 250–254 [251], Advances in Resist Technology and Processing II (1985). THFA has been disclosed as a solvent for other aliphatic lithographic compositions in U.S. Pat. Nos. 4,929,533 and 4,917,988; as a developer for aliphatic light sensitive layers in U.S. Pat. Nos. 4,863,835 and 3,576,634 "where other alcohols also work"; as chemically incorporated into linear photoresist in U.S. Pat. Nos. 4,931,379 and 4,025,348; and in other applications "where THF also works effectively".

THFA in the process of this invention, however, is surprisingly employed as a polar aromatic polymer EBR composition which further comprises other solvent diluents such as, for example, esters, ketones, ethers and glycol ether acetates, particularly cyclohexanone, cyclopentanone, propylene glycol methyl ether acetate, ethyl lactate, ethyl acetate, butyl acetate, and acetone.

In a particularly preferred embodiment THFA is used in admixture with a diluent, which diluent although not being a true solvent for the edge bead polymer, serves as a sufficiently "enhancing" co-solvent to permit as little as 10% by weight of the truly active solvent THFA to effectively function in the EBR mixture. Preferably, cyclohexanone is employed as such a diluent. The EBR composition of the present accordingly comprises at least 10% by THFA. Preferably, it comprises from 10% to 40% by weight THFA although it is particularly preferred to employ 10% to 20%.

In process of this invention, the composition serves as an EBR for photoresist as distinguished from a mere photoresist solvent. Although some solvents are employed in formulating photoresist, the same solvent may not necessarily serve as an EBR for that same photoresist, such as xylene in conventional positive-tone novolac photoresist. This is because the xylene is present to modify the evaporation rate during spincoating rather than act as a principal solvent for the resist components.

Photoresist to which the EBRs of the present are applicable include by way of example G-, H-, I-line positive-tone photoresists containing novolac resins and o-quinone diazide photoactive compounds; negative-tone, acid-catalyzed photoresist containing methylol-functional crosslinking agents; positive-tone, acid-catalyzed photoresists containing polyvinylphenol or novolac resins; polymethyl methacrylate deep ultraviolet photoresist. In a particularly preferred embodiment the composition of this invention is employed as an EBR for acid-catalyzed photoresist such as IBM APEX ® deep ultraviolet photoresist. The EBR of this invention does not contaminate the photoresist system even though airborne components may reach the photoresist surface and diffuse into it.

Multilevel microlithographic structures incorporating a photoresist and a layer of highly polar aromatic polymers such polyamic acids, polysulfones, and aromatic polyureas, which serve as, for example, anti-reflective layers, show particular improvement in edge bead removal. Therefore, the compositions of the present invention are particularly preferred in a novel method to remove such composite edge beads in rapid fashion, without contamination and without the need for baking.

In the process of the present invention, the EBR is dispensed dynamically for a few seconds onto the edge and backside of the wafer at ambient temperature and humidity, substantially dissolving the edge bead. After dispensing the EBR, the wafer is spun for an additional time to spin off the dissolved edge bead and to dry the edge and backside of the wafer. The overall removal cycle is 20–80 seconds. No bake cycle is needed to remove any residual liquid. The speed of the dynamic dispense is from 100 rpm to about 3000 rpm but preferably 500–2000 rpm. The duration of the initial spin cycle will be from 5 seconds to 20 seconds depending upon the spinning speed, the nature of the coating and size of the substrate.

After dispense, the wafer is spun at 1000–5000 rpm but preferably from 2000–3000 rpm for a period of 15–60 seconds. Evaporation of residual solvent is complete without the need to bake off liquid residue.

The following examples will illustrate the practice of the invention.

[THFA ® is a registered trademark of QO CHEMICALS, INC.]

EXAMPLE 1

"Microlithographic Substrate Cleaning and Compositions Therefor"

A series of solvent compositions were tested as edge bead removers to demonstrate the comparative advantages of THFA as a component for EBRs. The experimental EBRs were tested against three microlithographic coatings: Shipley Microposit ® 1470 (a G-line, positive-tone photoresist), Shipley XP89131 (a deep ultraviolet, acid-catalyzed, negative-tone photoresist), and an aromatic polyurea anti-reflective coating. Each coating was spincoated onto 3"silicon substrates at 5000 rpm for 60 seconds following a static dispense of the material. Immediately thereafter, the EBR was dynamically dispensed for 10 seconds onto the outer edge of the wafer while it was spinning at 2000 rpm. The wafer was then spun an additional 50 seconds at 2000 rpm to complete the edge bead removal cycle.

The wafer edges were inspected visually and microscopically to determine the quality of edge bead removal. Cleanliness ratings of A, B, C, or D were assigned accordingly, with the ratings referring to these conditions:

A—rough and/or jagged edge bead characterized by bleeding of the coating (most of edge bead removed)
B—fringing or rainbow appearance (slightly cleaner than condition A)
C—majority of edge bead not removed
D—complete edge bead removal

| Solvent | EBR Rating | | |
|---|---|---|---|
| | No THFA | +20% THFA | +40% THFA |
| Results with Shipley Microposit ® 1470 | | | |
| ethyl-3-ethyxypropionate | A | A | A |
| ethyl lactate | A | A | A |
| propylene glycol methyl ether acetate | A | A | A |
| cyclohexanone | D | D | A |
| cyclopentanone | B | AB | AB |

Conclusions: All compositions tests were reasonably good EBRs for standard positive photoresist. Cyclohexanone alone or with 20% THFA gave exceptional performance.

| Results with Shipley XP-89131 | | | |
|---|---|---|---|
| ethyl-3-ethyxypropionate | AB | AB | B |
| ethyl lactate | AB | ABC | AB |
| propylene glycol methyl ether acetate | AB | B | AB |
| cyclohexanone | B | D | ABC |
| cyclopentanone | B | B | B |

Conclusions: All compositions were reasonably good EBRs for the deep ultraviolet resist, though some variability was noted with ethyl lactate/THFA mixtures. Cyclohexanone with 20% THFA gave the best performance.

| Results with Aromatic Polyurea Anti-Reflective Coating | | | |
|---|---|---|---|
| ethyl-3-ethyxypropionate | C | C | C |
| ethyl lactate | C | B | B |
| propylene glycol methyl ether acetate | C | C | B |
| cyclohexanone | B | D | D |
| cyclopentanone | B | D | D |

Conclusions: THFA was necessary for good EBR performance. More THFA was needed with the ester solvents than the ketone

| Solvent | EBR Rating | | |
|---|---|---|---|
| | No THFA | +20% THFA | +40% THFA | solvents. Cyclohexanone with 20% THFA gave exceptional performance.

EXAMPLE 2

The drying rates of [1]a commercial EBR containing NMP, butyrolactone, and ethyl acetate, [2]an experimental EBR containing 50% NMP and 50% acetone, and [3]an experimental EBR containing 80% cyclohexanone and 20% THFA were compared as follows. [Note: A normally acceptable spin time for an EBR process is 45–60 seconds.]The EBRs were statically dispensed into the center of clean 3" silicon wafers and then spun at 2000 rpm. The time during which center-to-edge fringing could be observed was recorded as a measure of the spinning time needed to dry the EBR. (As a liquid spins off of a substrate, a series of interference fringes will move from the center to edge. When the fringes stop, the surface of the substrate is effectively dry.) At this point, the substrates were visually and microscopically examined for residues.

| EBR | Spin time required for fringing to stop (seconds) | Appearance of substrate imediately after fringing stopped |
|---|---|---|
| [1] | 120 | visually observable oily film |
| [2] | 70 | visually observable oily film |
| [3] | 30 | visually observable oily film |

(All of the oily residues could be removed by baking a few seconds at ≧90° C.)

Composition 3) was re-spun using a 60-second cycle as would be typical in the industry. The wafer was dry by visual observation. Conclusions: The THFA-based EBR [3] was significantly faster drying than the commercial NMP-based EBR [1] even though the latter contained a large proportion of a highly volatile solvent, ethyl acetate. (The flash point of composition [1] was reported as 30° F. whereas that of composition [3] was 116° F.) Composition [2] with relatively high NMP content showed a much slower drying rate than either [1] or [2].

EXAMPLE 3

THFA as a solvent for aromatic polyurea and for microelectronic coatings containing the same.
Advantages in terms of humidity sensitivity of coating A 20 wt. % solution of a highly aromatic polyurea was prepared in THFA by condensing bis ( 4- (4-aminophenoxy)phenyl ) sulfone (BAPPS) with methylenedi-p-phenyl diisocyanate (MDI). BAPPS ( 126.78 gm) was suspended in 800 gm THFA. Phenyl isocyanate (2.79 gm) was then added to partially endcap the divine. Next, MDI (70.43 gm) was added in a single charge to the endcapped diamine suspension. The suspension rapidly clarified to produce a clear, viscous polymer solution. Stirring was continued for 24 hours at 21° C. to complete the polymerization. The bulk viscosity of the finished polyurea solution was 6800 centipoise at 100° F. The solution was stable indefinitely at room temperature.

The above solution was diluted to ~5 wt .% with cyclohexanone and additional THFA to give a final cyclohexanone-to-THFA ratio of 70/30, w/w. This solution was spincoated at 5000 rpm (60 seconds) onto 3" and 5" silicon wafers to obtain defect-free, deep ultraviolet anti-reflective coatings of 0.13 μm thickness.

The coatings were baked at 205° C. for 60 seconds immediately after spinning.

When the same anti-reflective coating was formulated with N-methylpyrrolidone in place of THFA, good quality coatings could not be obtained at relative humidities in excess of ~45% at 71° F. The coatings formed voids or dewetted from the substrate under these conditions. The THFA-based product, however, formed excellent coatings up to ~65% relative humidity at the same temperature.

EXAMPLE 4

Example demonstrating that tetrahydrofuran, a close structural relative of THFA, is not a solvent for some aromatic polymers dissolved by THFA A 20 wt. % THFA solution of the polyurea described in Example 6 was dripped into a large volume of stirring tetrahydrofuran to see if the polyurea would be soluble forming a clear solution, or insoluble forming a precipitate. The polyurea rapidly precipitated into a white, leathery mass which did not dissolve with continued stirring.

EXAMPLE 5

THFA as component in edge bead removal solutions

Two commercial photoresists, Shipley Microposit® 1470 (A G-line positive-tone photoresist) and Shipley XP-89131 (a deep ultraviolet negative-tone photoresist), were applied onto 5" silicon substrates by spincoating at 5000 rpm (60 seconds) and 2500 rpm (60 seconds), respectively, and soft-baked for 60 seconds at 115° C. and 110° C. on a hotplate, respectively.

An experimental edge bead removal solution (EBR) was formulated by combining cyclohexanone and THFA in an 80/20, v/v, ratio. The EBR was dispensed from a microsyringe onto the edge of spinning resist-coated substrates to test edge bead removal with both resists. A small amount of the experimental EBR proved very effective in cleaning away the accumulated resists and left a residue-free edge.

The same solution was equally effective in removing a dried anti-reflective coating (composition and application as in Example 3) from the edge of a spinning silicon substrate.

An edge bead removal solution comprised only of cyclohexanone was not effective in removing the dried anti-reflective coating from the edge of the substrate.

What is claimed is:

1. An improved method for highly polar aromatic polymer edge bead removal from microlithographic substrates of the type wherein edge beads are formed, on spinning microlithographic wafers, from at least one layer of polymers having a predominance of benzenoid rings in the backbone of the polymer with the rings connected by polar chemical linkages, and said edge beads having glass transition temperatures in excess of 100° C., edge beads are removed by a cycle including dissolving said edge beads in a solvent composition containing N-methylpyrrolidone (NMP) as the active edge bead removal ingredient, leaving an oily residue and said cycle also including removing the oily residue by baking, the improvement comprising:

a. removing said edge beads by applying an edge bead removal composition without NMP and comprising at least 10% tetrahydrofurfuryl alcohol (THFA) as the active ingredient; and b. removing the oily residue during the spinning cycle without baking;

whereby the edge bead removal cycle is achieved 25% faster, and the need for the amine components of NMP is negated.

2. The improved method of claim 1 wherein the edge bead formed and removed from the substrate further comprises an edge bead formed from a photoresist layer.

3. The method of claim 2 wherein the photoresist is acid-catalyzed.

4. The method of claim 1 wherein the edge bead removal composition comprises from 10% to 40% by weight THFA.

5. The method of claim 4 wherein the composition comprises 10% to 20% THFA.

6. The method of claim 1 wherein the edge bead removal composition further comprises a diluent in an amount of from 60% to 90% by weight.

7. The method of claim 6 wherein the diluent is selected from the group consisting of cyclohexanone, cyclopentanone, propylene glycol methyl ether acetate, ethyl lactate, ethyl acetate, butyl acetate, and acetone.

8. The method of claim 7 wherein the diluent is cyclohexanone.

* * * * *